PARALLEL AMPLIFIER CIRCUIT HAVING LOAD EQUALIZATION MEANS

Filed Feb. 18, 1964 2 Sheets-Sheet 1

INVENTOR.
BILLIE JOE JONES
BY
Eugene M. Whitacre
Attorney

Dec. 13, 1966 B. J. JONES 3,292,094

PARALLEL AMPLIFIER CIRCUIT HAVING LOAD EQUALIZATION MEANS

Filed Feb. 18, 1964 2 Sheets-Sheet 2

INVENTOR.
BILLIE JOE JONES

BY Eugene M. Whitacre
Attorney

United States Patent Office 3,292,094

Patented Dec. 13, 1966

3,292,094

PARALLEL AMPLIFIER CIRCUIT HAVING LOAD EQUALIZATION MEANS

Billie J. Jones, Byesville, Ohio, assignor to Radio Corporation of America, a corporation of Delaware Filed Feb. 18, 1964, Ser. No. 345,737
6 Claims. (Cl. 330—15)

This invention relates to electrical signal amplifiers, and more particularly to high power amplifiers, such as push-pull amplifiers.

To deliver a predetermined amount of power to a load, which power exceeds the power rating of available amplifying devices, it has heretofore been proposed that a plurality of power amplifying stages be connected in parallel. One problem which arises with such a circuit is that of equalizing the load between the plurality of parallel connected stages. If one of the stages assumes too much of the load it may exceed the maximum power capabilities causing the associated device to be damaged or destroyed.

It is an object of this invention to provide an improved power amplifier circuit including a plurality of parallel connected amplifying stages.

Another of object of this invention is to provide an improved power amplifier circuit including a plurality of parallel connected amplifying stages wherein the load is uniformly distributed between the plurality of stages.

A power amplifier in accordance with the invention uses a combination of positive and negative direct current (D.-C.) feedback between the parallel amplifying stages to obtain equal sharing of the load characteristic.

In accordance with one of the invention a plurality of pairs of amplifying devices are connected as separate push-pull amplifier stages to drive a common load. Each push-pull amplifier has an input circuit coupled to a common signal source. In addition, each push-pull amplifier has an impedance element which is connected in a manner to develop a voltage proportional to the current through the amplifying devices used in the push-pull amplifier with which the impedance element is associated.

The voltage developed across the impedance element of a first push-pull amplifier is applied to the input circuit of a second push-pull amplifier in such a manner that an increase in the total current of the first push-pull amplifier tends to increase the current of the second push-pull amplifier. The voltage across the impedance element of the second push-pull amplifier is applied in like manner to the input circuit of the first push-pull amplifier. If more than two push-pull amplifying stages are used, the voltage across the impedance element of the second push-pull amplifier is applied to the input circuit of the third push-pull amplifier, and so on, with the voltage across the impedance element of the last push-pull amplifier being applied to the input circuit of the first push-pull amplifier.

Figure 1:
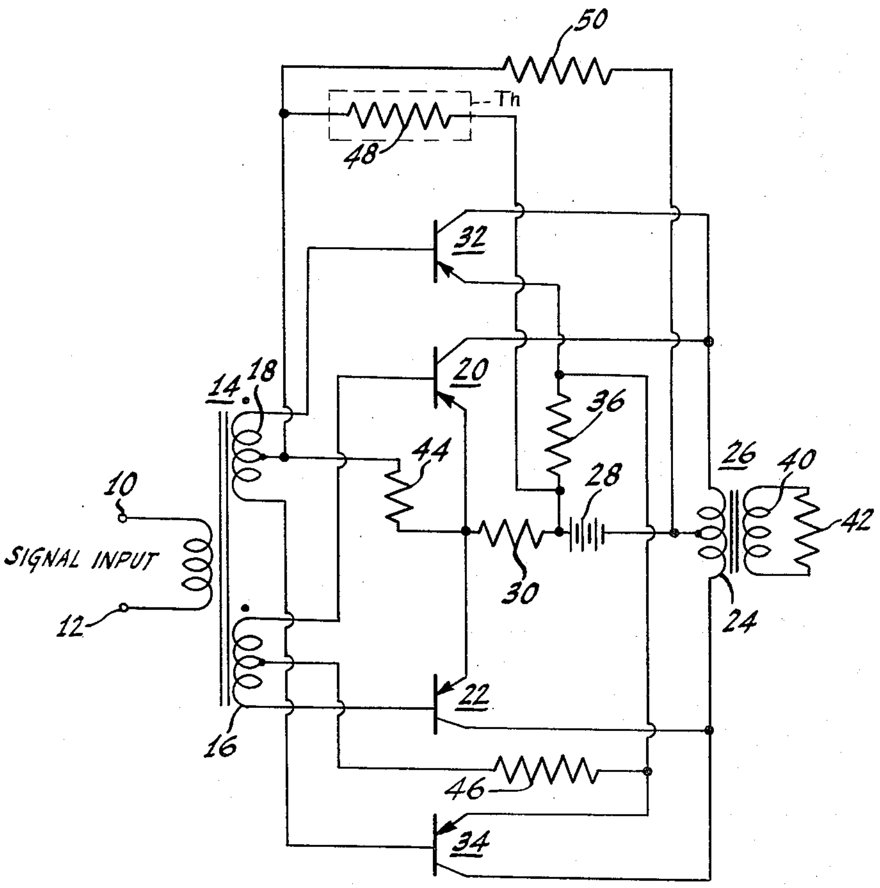
Figure 2:
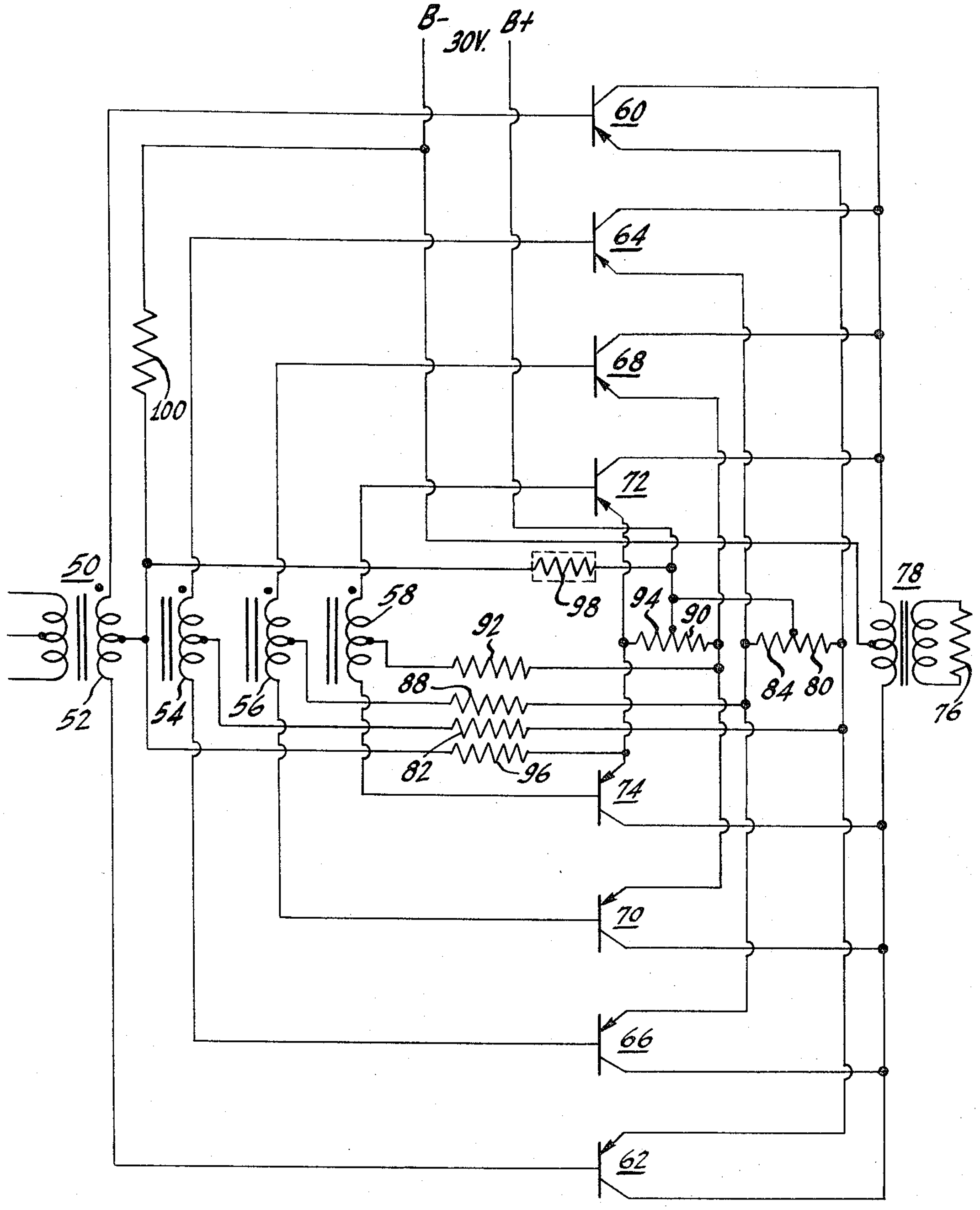

The novel features which are characteristic of this invention are set forth with particularity in the appended claims. The invention, itself, however, both as to its organization and method of operation as well as additional objects and advantages thereof will best be understood from the following description when read in connection with the accompanying drawings in which:

FIGURE 1 is a schematic circuit diagram of a pair of push-pull amplifier stages connected in parallel to drive a common load; and FIGURE 2 is a schematic circuit diagram of four push-pull amplifier stages connected in parallel to drive a common load.

Referring to FIGURE 1, signals from a suitable source, not shown, are applied to a pair of input terminals 10 and 12 at opposite ends of a primary winding of an input transformer 14. The input transformer 14 includes a pair of center-tapped secondary windings 16 and 18.

A first pair of transistors 20 and 22 are connected as a first push-pull amplifying stage, and the base electrodes of these transistors are connected to opposite ends of the secondary winding 16. The collector electrodes of the transistors 20 and 22 are connected to opposite ends of a center-tapped primary winding 24 of an output transformer 26. A suitable power supply, shown as a battery 28, and a resistor 30 are connected in series between the centertap of the primary winding 24 and the emitter electrodes of the transistors 20 and 22.

A second pair of transistors 32 and 34 are connected as a second push-pull amplifier stage, and the base electrodes of these transistors are connected to opposite ends of the secondary winding 18. The phasing of the secondary windings 16 and 18 is such that the base electrodes of the transistors 20 and 32 are driven in the same polarity direction, as indicated by the conventional transformer dots. The collector electrodes of the transistors 32 and 34 are connected to opposite ends of the primary winding 24 so that the collector electrodes of the transistors 20 and 32 are connected together and the collector electrodes of the transistors 22 and 34 are connected together. A resistor 36 is connected between the emitter electrodes of the transistors 32 and 34 and the junction of the battery 28 with the resistor 30.

A secondary winding 40 on the output transformer 26 couples the signals applied to the primary winding 24 to suitable utilization or load means shown as a resistor 42. Where audio frequency signals are being amplified, the load may comprise a sound reproducing device such as a loudspeaker.

As shown in the drawings, the two push-pull amplifier stages 20–22 and 32–34 are connected in parallel to drive the load 42. To equalize the power delivered by each of the parallel push-pull stages, a first resistor 44 is connected from the emitters of the transistors 20 and 22 to the centertap of the secondary winding 18, and a second resistor 46 is connected from the emitters of the transistor 32 and 34 to the centertap of the secondary winding 16. The resistor 44 applies the voltage developed across the resistor 30 to the base electrodes of the transistors 32 and 34 while the resistor 46 applies the voltage developed across the resistor 36 to the base electrodes of the transistors 20 and 22.

Circuit means for biasing one of the two push-pull amplifier stages to the proper operating condition will also properly bias the other push-pull stage. To this end a pair of resistors 48 and 50 are connected in series across the battery 28. The junction of the resistors 48 and 50 is connected to the centertap of the secondary winding 18 to provide the desired biasing voltage to the base electrodes of the transistors 32 and 34. The resistor 48 comprises a thermistor (as indicated by the legend Th) which stabilizes the transistors against thermal run-away.

In considering the operation of the amplifier circuit, if the first push-pull amplifier stage begins delivering more than its share of power to the load, the emitter-to-collector current of the transistors 20 and 22 increases, and is greater than the emitter-to-collector current of transistors 32 and 34. Under these conditions, more current flows through the resistor 30 causing the emitter terminal thereof to become more negative. This more negative voltage is applied through the resistor 44 and the secondary winding 18 to the base electrodes of the transistors 32 and 34 causing them to draw more current and to deliver a greater amount of power to the load. By the same token, since the transistors 32 and 34 are less conductive, the current through the resistor 36 is less, and the emitter terminal thereof becomes more positive. The more positive voltage is applied through the resistor 46 and the secondary winding 16 to the base electrodes of the transistors 20 and 22. The more positive voltage tends to reduce the amount of current drawn by the transistors 20 and 22 thereby reducing the amount of power delivered to the load from these transistors. This operation may be considered to be a combination of positive D.-C. feedback to the transistors 32 and 34, and negative D.-C. feedback to the transistors 20 and 22.

If the transistors 32 and 34 begin delivering more power to the load, the same conditions as mentioned above occur in reverse so that now the transistors 20 and 22 become more forwardly biased and the transistors 32 and 34 become less forwardly biased.

The thermistor 48 is thermally coupled to the various transistors to stabilize the circuit against thermal runaway. As the transistors heat up, the thermistor 48 becomes hotter thereby decreasing the resistance value thereof. As a result, the forward bias voltage applied to the base electrodes of the various transistors is reduced, to decrease the emitter-to-collector current thereof.

A greater number of push-pull amplifiers may be connected in parallel to drive a common load as is shown in FIGURE 2. In this circuit an input transformer 50 includes four centertapped secondary windings 52, 54, 56 and 58 each driving one push-pull amplifier stage. A first push-pull amplifier stage includes a pair of transistors 60 and 62 the base electrodes of which are connected to opposite ends of the secondary winding 52. A second push-pull amplifier stage includes a pair of transistors 64 and 66, the base electrodes of which are connected to opposite ends of the secondary winding 54. A third push-pull amplifier stage includes a pair of transistors 68 and 70, the base electrodes of which are connected to opposite ends of the secondary winding 56. The fourth push-pull amplifier stage includes a pair of transistors 72 and 74, the base electrodes of which are connected to opposite ends of the secondary winding 58. The four push-pull amplifier stages are connected in parallel to drive a load 76 through an output transformer 78.

A common emitter resistor 80 for the first push-pull amplifier stage develops a voltage proportional to the direct current flow through the transistors 60 and 62. This voltage is applied through resistor 82 to the centertap of the secondary winding 54 to control the bias on the transistors 64 and 66. Similarly, a common emitter resistor 84 for the second push-pull amplifier stage develops a voltage proportional to the current flow through the transistors 64 and 66. This voltage is applied through a resistor 88 to the centertap of the secondary winding 56 to control the bias on the transistors 68 and 70. In like manner a common emitter resistor 90 for the third push-pull amplifier stage develops a voltage proportional to the current flow through the transistors 68 and 70. This voltage is applied through a resistor 92 to the centertap of the secondary winding 58 to control the bias on the transistors 72 and 74. The voltage developed across the common emitter resistor 94 for the fourth push-pull amplifier stage is proportional to the current flow through the transistors 72 and 74 and is applied through a resistor 96 to the centertap of the secondary winding 52 to control the bias on the transistors 60 and 62 of the first push-pull amplifier stage.

As in the case of the circuit of FIGURE 1, a pair of resistors 98 and 100 are connected in series across the terminals of the operating potential supply means to develop a biasing voltage which is applied to the centertap of the secondary winding 52 for establishing the proper operating point on the various transistors of the circuit.

The load sharing equalization for the push-pull amplifier stage 52 operates in a similar manner to that described above with respect to FIGURE 1. In this regard suppose the second push-pull amplifier including the transistors 64 and 66 should begin to deliver more power to the load 76 than the other push-pull amplifiers. Under these conditions more current flows through the resistor 84 causing the emitter terminal thereof to become more negative. This more negative voltage is applied through the resistor 88 and the secondary winding 56 to the transistors 68 and 70 of the third push-pull stage, causing these transistors to conduct more. The process continues causing the transistors of the fourth and first stages to conduct more. The process works in reverse for a push-pull stage which does not deliver its proper share of power to the load.

The amplifier described in connection with FIGURE 2 develops 250 watts of power and is capable of maintaining the distribution of loading between the various push-pull amplifier stages to within 1.3%.

What is claimed is:

1. An amplifier system comprising:

means providing a source of signals, means providing a plurality of amplifier stages each having an input circuit coupled to said source of signals and an output circuit, and with each of said amplifier stages including impedance means for developing a voltage proportional to the amount of power delivered by the amplifier stage with which said impedance means is associated, means coupling said plurality of amplifier stages to drive a common load, means for applying the voltage developed by the impedance means associated with a first of said amplifier stages to a second of said amplifier stages in a polarity to increase the current through said second amplifier stage as the current through said first amplifier stage increases, and means for applying the voltage developed by the impedance means associated with the second of said amplifier stages to the first of said amplifier stages in a polarity to increase the current through said first amplifier stage as the current through said second amplifier stage increases.

2. An amplifier system as defined in claim 1 wherein the means for applying the voltage developed across the impedance means of the second of said amplifier stages to the first amplifier stage includes a plurality of amplifier stages.

3. An amplifier system comprising:

an input transformer having first and second centertapped secondary windings, first and second transistors each having base, emitter and collector electrodes, means connecting the base electrode of said first and second transistors to opposite ends of said first secondary winding, an output transformer including a centertapped primary winding connected between the collector electrodes of said first and second transistors, a source of operating potential and a first resistor connected in series between the centertap of the primary winding of said output transformer and the emitter electrodes of said first and second transistors, third and fourth transistors each having base, emitter and collector electrodes, means connecting the base electrodes of said third and fourth transistors to opposite ends of said second secondary winding, a second resistor connected between the emitter electrodes of said third and fourth transistors and the junction of said first resistor with said source of operating potential, means connecting the collector electrodes of said third and fourth transistors to opposite ends of the primary winding of said output transformer, a third resistor connected between the emitter electrodes of said first and second transistors and the centertap of said second secondary winding, a fourth resistor connected between the emitter electrodes of said third and fourth transistors and the centertap of said first secondary winding, and biasing means connected between said source of operating potential and the centertap of one of said secondary windings.

4. An amplifier system comprising:

an input transformer having a plurality of centertapped secondary windings, a plurality of pairs of amplifier devices, each of which is associated with one of said plurality of centertapped secondary windings and wherein each device of each pair of devices has an input electrode coupled to an opposite end of the secondary winding with which said pair is associated, a load impedance element, means connecting each of said pairs of amplifier devices in push-pull relation to drive said load impedance element, a plurality of impedance elements, each of which is connected to one of said pairs of amplifier devices to develop a voltage proportional to the current flowing through the pair of amplifier devices with which said impedance element is associated, and means for applying the voltage developed across the impedance element associated with first of said pairs of amplifier devices to the centertap of the secondary winding associated with a second of said pairs of amplifier devices and for applying the voltage developed across the impedance element associated with a third of said pairs of amplifier devices to the centertap of the secondary winding associated with the first of said pairs of amplifier devices.

5. An amplifier system for supplying power to a load comprising:

a plurality of push-pull amplifier stages $N_1, N_2 \ldots N_n$ connected in parallel to supply said load in common, a plurality of bias control means equal in number to said plurality of amplifier stages, one of which connects said $N_1$ amplifier stage to said $N_2$ amplifier stage and another of which connects said $N_n$ amplifier stage to said $N_1$ amplifier stage, each of said bias control means being responsive to changes in the power supplied to said load by one of the two amplifier stages with which it is associated to change in the same direction the power supplied to said load by the other of the two amplifier stages with which it is associated.

6. An amplifier system comprising:

means providing a source of signals, means providing a plurality of amplifier stages each having an input circuit coupled to said source of signals and an output circuit, and with each of said amplifier stages including impedance means for developing a voltage proportional to the amount of power delivered by the amplifier stage with which said impedance means is associated, means coupling said plurality of amplifier stages to drive a common load, means for applying the voltage developed by the impedance means associated with a first of said amplifier stages to a second of said amplifier stages in a polarity to increase the current through said second amplifier stage as the current through said first amplifier stage increases, and means for applying the voltage developed by the impedance means associated with the second of said amplifier stages to the first of said amplifier stages in a polarity to decrease the current through said first amplifier stage as the current through said second amplifier stage decreases, to maintain constant the power delivered by said amplifier stages to said load.

References Cited by the Examiner

UNITED STATES PATENTS

| | | | |
|---|---|---|---|
| 2,536,651 | 1/1951 | Merhaut | 330—134 X |
| 2,875,284 | 2/1959 | Ehret | 330—30 |
| 2,941,154 | 6/1960 | Rogers | 330—30 X |
| 3,013,200 | 12/1961 | Dortort | 321—27 |
| 3,046,488 | 7/1962 | McVey | 330—30 |
| 3,096,486 | 7/1963 | Atherton | 330—30 X |

FOREIGN PATENTS

| | | |
|---|---|---|
| 129,238 | 9/1960 | U.S.S.R. |

ROY LAKE, *Primary Examiner.*

F. D. PARIS, *Assistant Examiner.*